United States Patent
Putzeys et al.

(10) Patent No.: US 11,082,017 B2
(45) Date of Patent: Aug. 3, 2021

(54) AMPLIFIER WITH A COMPENSATOR WITH A NETWORK OF AT LEAST THIRD ORDER

(71) Applicant: PURIFI APS, Hojbjerg (DK)

(72) Inventors: Bruno Putzeys, Achel (BE); Lars Risbo, Hvalso (DK)

(73) Assignee: PURIFI APS, Hojbjerg (DK)

( * ) Notice: Subject to any disclaimer, the term of this patent is extended or adjusted under 35 U.S.C. 154(b) by 0 days.

(21) Appl. No.: 16/770,279

(22) PCT Filed: Jul. 20, 2018

(86) PCT No.: PCT/EP2018/069763
§ 371 (c)(1),
(2) Date: Jun. 5, 2020

(87) PCT Pub. No.: WO2019/110154
PCT Pub. Date: Jun. 13, 2019

(65) Prior Publication Data
US 2020/0313633 A1    Oct. 1, 2020

(30) Foreign Application Priority Data

Dec. 7, 2017   (EP) ................................ 17205945

(51) Int. Cl.
*H03F 3/21*    (2006.01)
*H03F 3/217*   (2006.01)

(52) U.S. Cl.
CPC ..... *H03F 3/2171* (2013.01); *H03F 2200/126* (2013.01); *H03F 2200/141* (2013.01); *H03F 2200/171* (2013.01); *H03F 2200/78* (2013.01)

(58) Field of Classification Search
CPC .................................................... H03F 3/2171
See application file for complete search history.

(56) References Cited

U.S. PATENT DOCUMENTS

| | | | |
|---|---|---|---|
| 3,638,210 A * | 1/1972 | Hankins | G01S 15/523 340/507 |
| 4,041,411 A | 8/1977 | Sturgeon | |
| 5,459,438 A * | 10/1995 | Mirow | H03B 5/20 331/137 |
| 6,297,692 B1 | 10/2001 | Nielsen | |
| 7,113,038 B2 | 9/2006 | Putzeys | |
| 7,142,050 B2 | 11/2006 | Risbo | |

(Continued)

FOREIGN PATENT DOCUMENTS

| | | |
|---|---|---|
| EP | 1770855 A1 | 4/2007 |
| GB | 2439983 A | 1/2008 |

(Continued)

OTHER PUBLICATIONS

International Preliminary Report on Patentability from PCT Application PCT/EP2018/069763, Feb. 19, 2020.

(Continued)

*Primary Examiner* — Patricia T Nguyen
(74) *Attorney, Agent, or Firm* — Workman Nydegger

(57) ABSTRACT

An amplifier comprising a gain stage with a feedback network comprising two ports between which at least three capacitors are connected in series and between each pair of capacitors a resistor is connected to a predetermined voltage. The gain stage is provided in a feedback loop over a primary amplifier.

13 Claims, 7 Drawing Sheets

(56) References Cited

U.S. PATENT DOCUMENTS

| | | | |
|---|---|---|---|
| 7,852,150 | B1 | 12/2010 | Arknaes-Pedersen |
| 8,049,557 | B2 | 11/2011 | Putzeys |
| 8,497,746 | B2* | 7/2013 | Visconti ............... H03H 11/126 333/173 |
| 8,736,367 | B2 | 5/2014 | Bostrom |
| 2001/0030529 | A1 | 10/2001 | Stanley |
| 2005/0017799 | A1 | 1/2005 | Risbo et al. |
| 2006/0008095 | A1 | 1/2006 | Tsuji |
| 2007/0009812 | A1 | 1/2007 | Ito et al. |
| 2007/0052478 | A1 | 3/2007 | Candy |
| 2007/0057721 | A1 | 3/2007 | Risbo et al. |
| 2007/0096812 | A1 | 5/2007 | Lee |
| 2008/0180278 | A1* | 7/2008 | Denison ............... A61B 5/7203 340/870.18 |
| 2010/0073063 | A1 | 3/2010 | Lakshmikumar et al. |
| 2013/0057331 | A1 | 3/2013 | Yuan et al. |
| 2015/0214902 | A1 | 7/2015 | Lin |
| 2016/0352293 | A1 | 12/2016 | Bostrom |
| 2017/0230019 | A1* | 8/2017 | Chandrakumar .... A61B 5/7207 |

FOREIGN PATENT DOCUMENTS

| | | |
|---|---|---|
| JP | 2001503575 A | 3/2001 |
| WO | 01/71905 A2 | 9/2001 |
| WO | 2005/002050 A1 | 1/2005 |
| WO | 2007/099442 A1 | 9/2007 |
| WO | 2013/164229 A1 | 11/2013 |
| WO | 2016091620 A1 | 6/2016 |

OTHER PUBLICATIONS

International Search Report and Written Opinion from PCT Application No. PCT/EP2018/069763, dated Sep. 5, 2018.

Extended European Search Report from EP Application No. EP17205945.3, dated May 31, 2018.

Nelson Pass, "Phase Coherent Crossover Networks", Aug. 2, 1998, 6 pages, retrieved from the Internet on May 31, 2018 from: URL:https://www.passlabs.com/sites/default/files/phasecrx.pdf.

Office Action from corresponding EP application No. 18740251.6, dated Apr. 21, 2021.

* cited by examiner

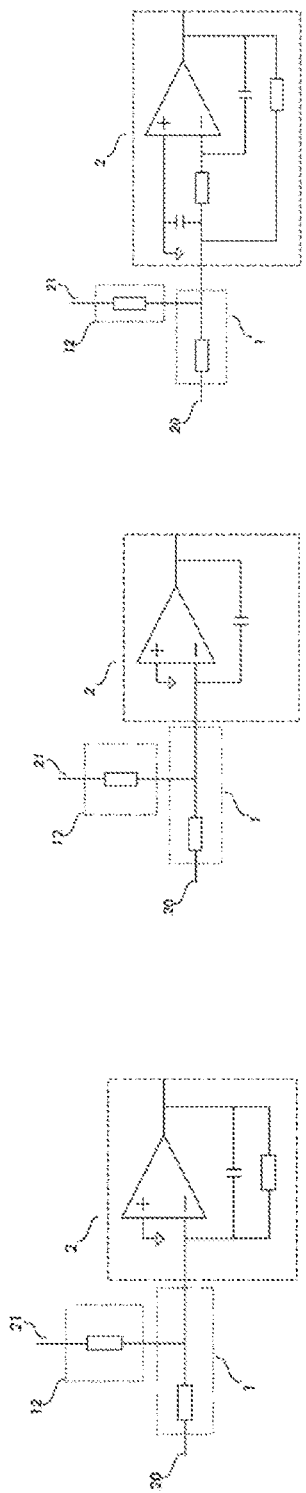
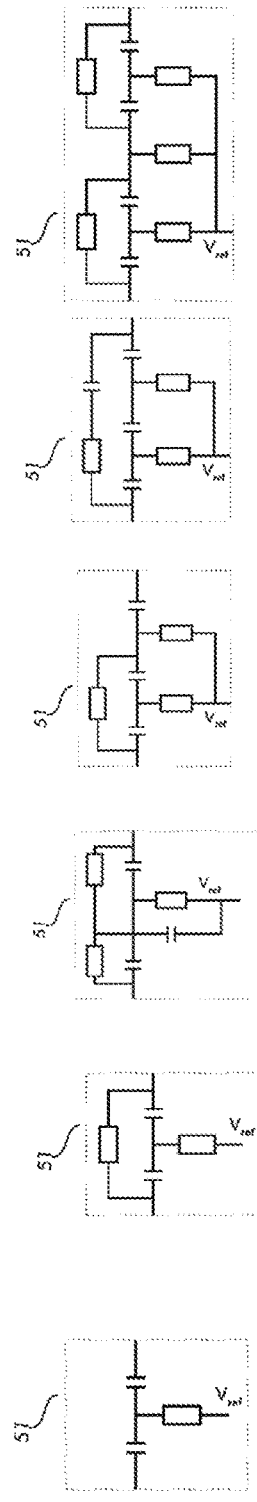
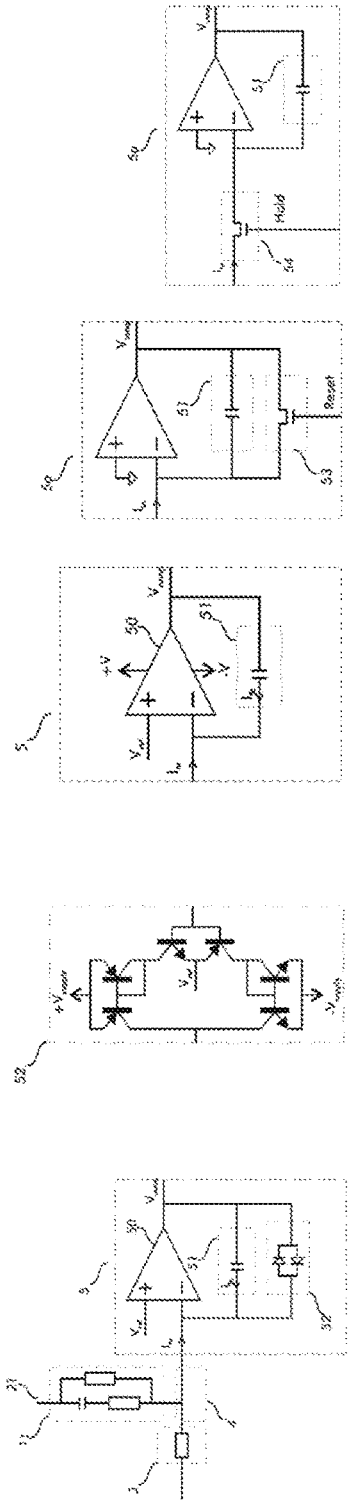
Figure 5
Figure 6
Figure 7
Figure 8
Figure 9
Figure 10
Figure 11
Figure 12
Figure 13
Figure 14
Figure 16
Figure 17
Figure 18
Figure 19

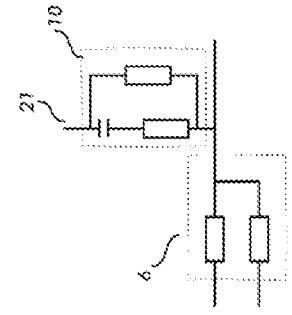
Figure 23
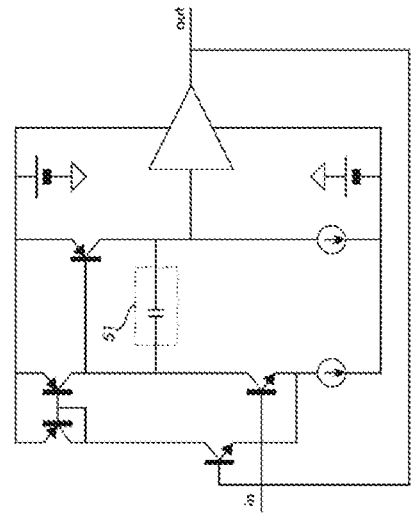
Figure 24
Figure 22
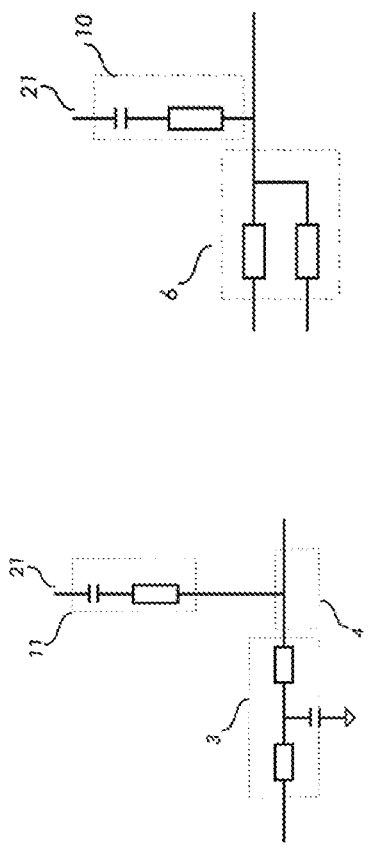
Figure 21
Figure 20
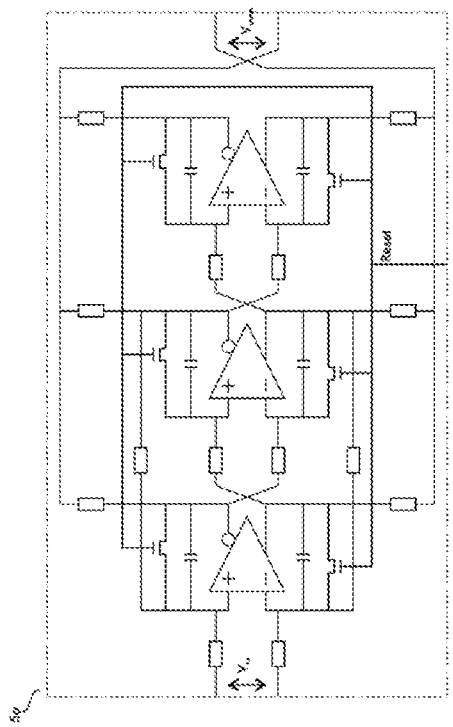

AMPLIFIER WITH A COMPENSATOR WITH A NETWORK OF AT LEAST THIRD ORDER

BACKGROUND AND SUMMARY

The present invention relates to an amplifier with a compensator with a network where at least three capacitors are connected in series.

Amplifiers and relevant technology may be seen in U.S. Pat. Nos. 4,041,411, 7,142,050, 8,049,557, 8,736,367, US2015/214902, WO2013/164229 and US2016/0352293.

In a first aspect, the invention relates to an amplifier comprising:
- a compensator having:
  - a network comprising two ports between which at least three capacitors are connected in series and between each pair of capacitors a resistor is connected to a predetermined voltage, and
  - a gain stage having:
    - an gain stage input, connected to one port and
    - an gain stage output connected to the other port, and
- a primary amplifier having:
  - a primary amplifier output operatively connected to the gain stage input and
  - a primary amplifier input operatively connected to the gain stage output.

In the present context, an amplifier is an element configured to receive a signal, such as an audio signal, and output a corresponding signal, preferably with a higher signal amplitude. Often, an audio amplifier receives an electrical audio signal of a low signal strength (voltage) and outputs a corresponding signal with a higher signal strength. In this context, two signals correspond if they have at least substantially the same spectral contents in at least a frequency interval.

It is noted that an amplifier may be used for amplifying other types of signals than audio signals. An amplifier may be used as a power supply or controller feeding e.g. a linear actuator so as to drive the actuator in a controlled manner. In this situation, the amplifier may receive a lower amplitude signal corresponding to what is desired to be fed to the actuator, where the amplifier will output a current or voltage adapted to the requirements of the actuator.

The amplifier has a compensator with a network and a gain stage, where the network is provided as a feedback loop around the gain stage and where the gain stage is provided in a feedback loop around a primary amplifier.

In this context, an input is a portion of a circuit, for example, configured to receive a signal. In many situations, an input is a conductor, such as a conductor of an electrical element, a chip/ASIC or the like. An input may comprise a connector, such as if the input is an input to the amplifier proper (such as from outside of an amplifier casing and/or from a pre-amplifier). Then, a signal source may be detachably connected to the input to deliver a signal to the input. Alternatively, an input may be an input into a portion of the amplifier, where detachability is not desired, so that the input may be a permanent connection. Permanent connections may be obtained via e.g. a conductor, a solder pad or the like to which another element may be permanently connected, such as by soldering, in order to deliver a signal to the input. Naturally, the input may be an internal portion, such as a conductor, of a chip or the like, between portions of the chip.

An output, as the input, may be an output to the surroundings of the amplifier, so that the output may comprise a connector for detachable attachment to e.g. a load, a cable or the like. Alternatively, an output may be an output from one component of the amplifier to another component. If such components are not desired detachable, the output may be permanently connected thereto. In permanently connected situations, an output may be a conductor, leg or the like, where one end of the conductor may be an input and the other end an output.

Often, the primary amplifier output is also the output of the amplifier proper, such as if the outputs share the same conductors. It may be desired, however, to connect further circuits, such as filters, between these outputs, after the amplifier output or simply to the outputs. Usually, an LC filter is connected to the output to remove high frequency noise stemming from the operation of the primary amplifier, so that this noise is not carried on to a load connected to the output. It is noted that the outputs may share a connector to which one port of a filter is connected.

The primary amplifier is an amplifier in itself. Thus, it may behave as the above-described amplifier. However, the primary amplifier may be desired to, or allowed to, have other parameters or another behaviour than that/those of the overall amplifier. For example, even though self-oscillation in itself may not be a requirement to the overall amplifier, the primary amplifier may be configured to be self oscillating, such as if the compensator is configured to control the primary amplifier away from oscillation or in a manner so that this oscillation is desirable.

As will be described below, the primary amplifier preferably is a Class D amplifier. However, the primary amplifier may alternatively be a linear amplifier based on legacy components, such as transistors and the like, that may be conventionally biased to operate in class A, class B or class AB.

The primary amplifier has a primary amplifier input and a primary amplifier output which may be as the input and output described above. It is noted that it is not usually desired to be able to detach the primary amplifier from the paths mentioned below, so that the primary amplifier input/output may be formed by conductors or the like on e.g. a PCB, within a circuit, between circuits or the like.

As mentioned, the primary amplifier output is operatively connected to the gain stage input and the primary amplifier input is operatively connected to the gain stage output.

That an input is operatively connected to an output, or vice versa, in the present context, means that a signal may be fed from the input to the output. This signal may, however, be filtered, amplified, attenuated or a combination thereof along the path between said input and said output.

A path may be defined from the input, such as the gain stage input, to the output, such as the primary amplifier output (and vice versa), which path may be a simple conductor or which may comprise electronic components, such as resistors, inductors, capacitors, amplifiers, summing nodes, or the like.

In general, a network is a circuit, which may simply be a conductor but which often comprises one or more electrical components, active and/or passive. The network has two or more ports or conductors/connectors to/from which signals may be fed to the network and/or derived from the network.

In the network of the present compensator, at least three capacitors are provided in series between two ports. Naturally, additional electronic components, such as additional capacitors, resistors, inductors, amplifiers, active or passive components, may be provided.

Three capacitors are connected in series between the ports when a main path exists from the first port to the second port which main path goes through the three capacitors one after the other. Paths containing other components may branch off the main path and may also rejoin the main path. Also, the main path may contain further components like resistors.

Between each pair of capacitors, a resistor is connected (to the capacitors) to a predetermined voltage. This predetermined voltage preferably is at least substantially constant, such as ground.

Thus, when three capacitors are connected in series, two such resistors are provided. The resistors are preferably connected to the same, predetermined voltage, but this is not a requirement.

One or more elements, such as switches, may be provided for short-circuiting one, two or more, such as all, capacitor(s) or for defining or limiting a voltage across the capacitor(s). This may be a reset functionality which is often desired. The reset functionality may be permanent or intermittent.

Preferably the frequency response of the compensator (the compensator gain as a function of frequency) is substantially inversely proportional to the frequency response of the network. The overall advantage of having three or more capacitors in series in the network is that the overall behaviour of the network is that of a high pass filter of at least third order and that therefore the compensator will have significantly increased gain at low frequencies In one embodiment, a second network is provided having at least one resistor placed in parallel with one or more of the capacitors of the network. Adding such resistors has the advantage that compensator gain at intermediate frequencies can be traded for compensator gain at DC. A compensator using a three-capacitor network without the second network will have, at low frequencies, a third order slope and possibly more compensator gain at DC than strictly required. The second network allows some of that gain to be sacrificed while compensator gain at higher frequencies is increased.

In a preferred embodiment the gain stage is an operational amplifier. However, the gain stage may be a transistor or FET if desired.

In the present context, a compensator is a circuit which, by virtue of the operative connections, is connected in a feedback loop between the output and input of the primary amplifier. The compensator will, due to the network, behave as a filter of at least third order. The overall function of the compensator may be to regulate the output of the primary amplifier more closely to its desired value.

In a preferred embodiment, a signal from an input of the amplifier is also fed to the comparator. Then, the compensator preferably filters an error signal found by comparing a signal derived from the amplifier input to a signal derived from the primary amplifier output, in such a way that in a first frequency range the error signal is amplified and in a second frequency range it may not be amplified, or even attenuated. The first frequency range corresponds to the desired frequency band of operation. In an audio amplifier, this bandwidth could be e.g. to 0 Hz-40 kHz, 0 Hz-20 kHz, or 20 Hz-20 kHz. The second frequency range could be a band above the first band e.g. 60 kHz and up, 100 kHz and up. The second frequency band does not have to go on indefinitely or even to a very high frequency such as 1 MHz. In the case of a class D amplifier, the second frequency range typically includes the switching frequency. In legacy, linear amplifiers, the second frequency range may end at 1 MHz.

The compensator usually is provided not only in a feedback loop from the primary amplifier output to the primary amplifier input but also in a forward path from the input of the amplifier proper to the primary amplifier input.

In a preferred embodiment, the compensator is configured to have at least two operating modes. Different reasons may exist for selecting a particular operating mode of the compensator. One mode of operation may even be completely disabling the compensator, if desired.

Different operating modes may utilize different portions of the network or otherwise alter the filtering characteristics of the network.

In one embodiment, the mode of operation selected for the compensator is determined by the operation of another portion of the amplifier, typically the primary amplifier. Then, the primary amplifier may be configured to operate in one of at least a first and a second amplifier operating mode.

One amplifier operating mode may be a mode wherein the primary amplifier has a particular frequency response, a particular gain, switching frequency in a particular range or the like. Often, the first amplifier mode is the desired operating mode, where the second amplifier mode is a mode which is not preferred but which may not be completely avoidable in the primary amplifier. A typical second amplifier mode is a clipping mode where the primary amplifier produces an output voltage substantially limited by the power supply voltages, stops switching or switches at a frequency outside the range of the first mode. When operating in clipping mode, the primary amplifier has only a negligible response to changes in the primary amplifier input signal.

Thus, the first amplifier mode may be characterized as a mode wherein the additional change in the primary amplifier output signal in response to an additional small change in the primary amplifier input signal is substantially the same as the response of the primary amplifier output signal to a signal consisting of only that additional change in the primary amplifier input signal. That is to say, when the presence of a large signal has not materially impacted the ability of the primary amplifier to respond to an additional small signal.

A third mode may be where the primary amplifier protects itself against a potentially damaging load condition. It may do so, for instance, by turning off temporarily.

A fourth mode may be where the primary amplifier is turned off. This may be as part of a power up/down sequence or a result of a command by the user.

The compensator and/or the gain stage, in one mode of operation, may be disabled, such as when the primary amplifier is operating at least in the second amplifier operating mode. This disabling may be embodied in any desired manner and may render the gain stage or compensator out of operation in a number of manners. In one situation, the compensator may, when disabled, prevent transfer of signals there through, such as along a path in which the compensator is provided. Thus the compensator may effectively prevent signal transport in a feedback loop over the primary amplifier.

Further, if the compensator is also provided in the forward path from an input of the amplifier proper to the primary amplifier input, this path may also be blocked.

In another situation, the disabling may be obtained by rendering the compensator "invisible", such as by providing the compensator with no frequency filtering capabilities, such as when it has a predetermined gain, such as unity gain, over a frequency interval of interest (such as 0 Hz-100 kHz). Then, the disabled compensator will allow transport of signals across it.

Even though a large number of manners exist of affecting e.g. the network to obtain the desired properties of the compensator, it is preferred that, in one operating mode, one or more of the capacitors are short-circuited. In one mode, all capacitors are short circuited. In this mode, the gain stage may comprise an operational amplifier. When all capacitors between the output and an input of the operational amplifier are short circuited, this may provide the network with a frequency independent behaviour—imposing a frequency independent behaviour to the compensator or at least reducing the gain and the phase shift of the compensator at low frequencies.

This short circuiting may be obtained in a number of manners. In one situation, the network comprises a diode or two anti-parallel diodes which automatically become conductive—and thus short circuiting components connected in parallel thereto—when a voltage over the diode(s) exceeds the forward voltage of the diode(s). This voltage may be derived from the primary amplifier so that if the primary amplifier clips and thereby outputs an excessive voltage or deviates excessively from an expected voltage, the compensator will automatically be disabled.

In this context, a diode is connected across a capacitor when the two ports or connectors of the diode are connected to the two ports or connectors of the capacitor(s). If a diode is connected across multiple serially connected capacitors, the diode is connected to the opposite, outer connectors of the serially connected capacitors. Naturally, multiple diodes may be used for short circuiting multiple capacitors.

When a voltage over a diode exceeds the forward voltage of the diode, the diode becomes conducting and will thus short circuit any capacitor(s) it is across. If multiple diodes are provided in series, they will become conducting when the voltage across them exceeds the combined forward voltages.

An alternative method would be to have another circuit determine that the primary amplifier has left the first amplifier operating mode or is in the second, third or fourth amplifier operating mode and then send a predetermined signal to the compensator to which the compensator is configured to react, such as to have the compensator disable itself. This signal may, e.g. cut off the power to the compensator.

In other situations, a detection circuit may determine that the primary amplifier has left the first amplifier operating mode or is in the second, third or fourth amplifier operating mode and then send a predetermined signal to the compensator to which the compensator is configured to react so as to disable itself.

Thus, the compensator gain stage may be configured to be turned off. This may be obtained e.g. when the above signal is used for e.g. cutting off the power to the gain stage, removing the bias current from the gain stage or short circuiting or disconnecting parts of the gain stage. Alternatively, short circuiting of at least a part of the network may be effected using switches, for example transistors or FETs operated as switches and controlled by the signal from the detection circuit. Alternatively, such a switch may be inserted in series with the input of the compensator and configured to be normally on (i.e. closed) but turned off when the detection circuit has determined that the primary amplifier is e.g. in the second amplifier operating mode.

In one embodiment, the a transconductance amplifier is connected across one or more of the capacitors, which is operated when the primary amplifier is at least in the second amplifier operating mode. This has an effect similar to short circuiting, in that the capacitor voltage cannot evolve further. A transconductance amplifier does not require its input and output to be at the same potential.

In one embodiment, a connection between the compensator gain stage input and the primary amplifier output is disconnected in one operating mode. Then, the feedback loop over the primary amplifier is disconnected and the error generated by the primary amplifier will not charge the capacitors further, so that when the primary amplifier re-enters the first amplifier operating mode, the operation is not affected by charge stored in the capacitors during the period in which the primary amplifier was not operating in the first amplifier operating mode.

As mentioned, the compensator may be operated in one operating mode, when the primary amplifier clips, and in another operating mode, when the primary amplifier is not clipping, such as during normal or desired operation.

In one embodiment, the amplifier has a user operable element configured to have the compensator operate in a predetermined mode of operation. This user operable element may be a switch, touch pad, keyboard, rotating knob, or the like. The user operable element may have a predetermined position or the like so that operation thereof makes the compensator operate in the predetermined mode of operation. Alternatively, the user operable element may be used for setting a parameter which, if e.g. exceeded, will make the compensator operate in the mode of operation. Thus, by setting this parameter, the user may affect when the compensator is brought into the predetermined mode of operation. This mode of operation may be a disabling of the compensator.

In a preferred embodiment, the primary amplifier is a class D amplifier. Class D amplifiers usually comprise a comparator and a switching power stage controlled by the comparator. Normally, the primary amplifier input is connected to or constituted by an input to the comparator. A Class D amplifier may be self oscillating or have an oscillating frequency imposed on it. In general, a Class D primary amplifier has an idle switching frequency. The idle switching frequency may be determined by removing all input signal and measuring the average period of the on/off cycle found at the power stage.

Usually, the idle switching frequency is in the range of 200 kHz-2 MHz.

In this context, a power stage is a circuit that controls current flow from a power supply to a load in response to a control signal. In this context, a switching power stage is a power stage in which all power devices are operated either fully on or fully off for substantially all of the time. Power devices may be transistors, FETs, IGBTs and the like.

Also, a comparator normally, in Class D amplifiers, is a circuit that outputs a binary signal corresponding to the sign of the difference between two input signals, or between an input signal and a predetermined voltage.

In this context, the output signal of the comparator acts as the control signal to the switching power stage.

The switching power stage output may form the primary amplifier output or be connected thereto. Often, a filter, such as a low pass filter often called an output filter, is connected to the primary amplifier output in order to remove high frequency components from the switching stage, but this filter is not always required and may be provided outside of the primary amplifier or inside the primary amplifier, such as between the primary amplifier output and the power stage output.

When the primary amplifier is a Class D amplifier, it preferably further comprises a first feedback filter connected between the primary amplifier output and an input of the comparator and/or the input to the primary amplifier The first feedback filter may be a high pass filter and preferably is a high pass filter which, in a significant portion (such as at least 30%) of the range between and 20 Hz and 20 kHz, has a gain at a first frequency which is lower than the gain at a second frequency which is twice the first frequency. Preferably the gain at the second frequency is at least 1.5 times the gain at the first frequency.

In this context, a high pass filter is a filter whose gain exhibits an upward trend over at least a desired frequency interval. In the present context, the relevant frequency interval is between a quarter and one half of the idle switching frequency wherein the gain is higher (lower attenuation) at higher frequencies and lower (higher attenuation) at the lower frequencies.

The feedback loop through first feedback filter is used to program the frequency response of the primary amplifier. If the primary amplifier is a linear amplifier, a circuit element corresponding to the first feedback filter may or may not exist, depending of whether the circuit used as primary amplifier already has a frequency response that makes it useful to apply the teachings of this invention around. If not, a first feedback filter may be used in a feedback loop around the linear amplifier to obtain the desired frequency response.

This first feedback filter may have any order. In legacy Class D amplifiers, this filter is a first order filter, but it may be advantageous to use a higher order filter instead. This has the effect of increasing the closed loop gain of the primary amplifier, thereby increasing the loop gain available to the loop closed through the first summing node.

As mentioned above, a path, normally called a forward path, may be defined between an input of the amplifier proper to the primary amplifier input. Preferably, the compensator is provided in the forward path.

Preferably, the forward path also or alternatively comprises a low pass filter. Additionally the low pass filter may be placed inside a feedback loop by feeding the low pass filter from a summing node that combines a signal derived from the input and a signal derived from the output. The advantage of providing a low pass filter in the forward path is that in addition to attenuating high-frequency components in the input signal, it adds loop gain.

When the primary amplifier is a Class D amplifier, the low pass filter is preferably adapted to the switching frequency to attenuate this switching frequency relative to lower frequencies. In one embodiment, the low pass filter has a first gain at the idle switching frequency, and a second gain at half the idle switching frequency, where the second gain is at least one and a half times the first gain. Preferably, the second gain is at least 2 times the first gain, or even at least 3, 4, 5, 6, 7, 8, 9, 10 or more times the first gain.

In one embodiment, the amplifier further comprises a third path from the output to an input of the compensator. This path, together with a path from the amplifier input, allows the compensator to generate an additional input signal to the primary amplifier based on an error signal derived from the signals supplied through the paths from the output and the input to the input of the compensator. By filtering and amplifying the error signal the compensator will produce a signal that counteracts the distortion generated by the primary amplifier, at least within a desired frequency band.

In an embodiment, the primary amplifier is configured to act substantially as an integrator. If the primary amplifier is a class D amplifier, this can be done by configuring the first feedback filter to be a high pass filter, such as a high pass filter with negligible gain at DC. An integrating amplifier, in the present context, is an amplifier which acts substantially like an integrator. That is to say that over a significant portion (such as at least 30%) of the range between and 20 Hz and 20 kHz the gain at a first frequency is higher than the gain at a second frequency which is twice the first frequency. Preferably the gain at the first frequency is at least 1.5 times the gain at the second frequency.

Advantageously then, one or more further feedback paths may be provided, only one of which has a substantial DC gain. This is a second aspect of the invention.

In one embodiment of the invention, a first feedback or loop is additionally provided between the primary amplifier output, which may be the output of the amplifier proper, and the gain stage input. This loop, naturally, may comprise additional elements, such as filters, but may act together with the network to further shape the gain curve of the amplifier. In one situation, the loop has a response curve or gain curve with a localized anti-resonance or dip in the frequency interval of 10-100 kHz.

In that or another embodiment of the invention, a second feedback or loop is additionally provided between the primary amplifier output, which may be the output of the amplifier proper, and the gain stage output. This second loop, naturally, may comprise additional elements, such as filters, but may act together with the network to further shape the gain curve of the amplifier. In one situation, the loop has a response curve or gain curve with a localized anti-resonance or dip in the frequency interval of 10-100 kHz.

In a third aspect, the invention relates to a primary amplifier comprising
 A network comprising a first port and a second port between which at least two capacitors are connected in series and between each pair of capacitors a resistor is connected to a predetermined voltage,
 a primary amplifier input,
 a primary amplifier output
 a switching power stage
 a power stage input and
 a power stage output operatively connected to the first port and
 a comparator having
 a comparator input connected to the second port and
 a comparator output connected to the power stage input.

This aspect relates to a particular type of primary amplifier. As will be described below, this primary amplifier may be used in the amplifier described in relation to the above aspects of the invention. Naturally, all embodiments, situations and considerations relating to the above aspects are equally relevant for this aspect.

As mentioned above, a primary amplifier is an amplifier in itself, but it may be allowed to have another desired operating mode than usual audio amplifiers.

The primary amplifier comprises a network comprising two ports between which at least two capacitors are connected in series, and between each pair of capacitors a resistor is connected to a predetermined voltage.

In the network of the present primary amplifier, at least two capacitors are provided in series between the two ports. Naturally, additional electronic components, such as additional capacitors, resistors, inductors, amplifiers, summing nodes, active or passive components, may be provided.

Two capacitors are connected in series between the ports when a main path exists from the first port to the second port which main path goes through the two capacitors one after the other. Paths containing other components may branch off the main path and may also rejoin the main path. Also, the main path may contain further components like resistors.

Between each pair of capacitors, a resistor is connected (to the capacitors) to a predetermined voltage. This predetermined voltage preferably is at least substantially constant, such as ground.

Thus, if three capacitors are connected in series, two such resistors are provided. If more than one such resistor is provided, the resistors are preferably connected to the same, predetermined voltage, but this is not a requirement.

The overall advantage of having two or more capacitors in series between the ports is that the overall behaviour of the network is that of a high pass filter of at least second order.

The primary amplifier has an input and an output as well as a switching power stage and a comparator. As is usual in Class D amplifiers, the comparator is connected to the switching power stage. Then, the comparator input may form the input into the primary amplifier so that the primary amplifier input is connected to the comparator input or actually forms the comparator input. A filter may, e.g., be provided between the primary amplifier input and the comparator input if desired.

In the same manner, the switching power stage output may form the primary amplifier output or be connected thereto. Often, a filter, such as a low pass filter often called an output filter, is connected to the primary amplifier output in order to remove high frequency components from the switching stage, but this filter is not always required and may be provided outside of the primary amplifier or inside the primary amplifier, such as between the primary amplifier output and the power stage output.

In this context, a power stage is a circuit that controls current flow from a power supply to a load in response to a control signal. In this context, a switching power stage is a power stage in which all power devices are operated either fully on or fully off for substantially all of the time. Power devices may be transistors, FETs, IGBTs and the like.

Also, a comparator normally, in Class D amplifiers, is a circuit that outputs a binary signal corresponding to the sign of the difference between two input signals, or between an input signal and a predetermined voltage.

In this context, the output signal of the comparator acts as the control signal to the switching power stage.

This network is provided between the comparator input and the power stage output and thus forms a feedback loop over the power stage and comparator. The feedback loop is used to program the frequency response of the primary amplifier.

A resistor may be connected in parallel over e.g. two serially connected capacitors, when the conductors of the resistor are connected to the "outer" conductors of the capacitors.

Another aspect of the invention relates to an amplifier comprising:
an amplifier input,
a primary amplifier according to the third aspect, and
a low-pass filter having:
a filter input operatively connected to the primary amplifier output and to the amplifier input and
a filter output operatively connected to the primary amplifier input.

Naturally, all embodiments, situations and considerations relating to the above aspects are equally relevant for this aspect.

Naturally, the amplifier has an output which may be connected to the primary amplifier output or may be formed by the primary amplifier output. A filter may be provided at the primary amplifier output as described above.

The low-pass filter is provided between the primary amplifier input and the amplifier input and the primary amplifier output. Thus, a signal received at the amplifier input is filtered by the low-pass filter before arrival at the primary amplifier input. Additionally, a signal received from the primary amplifier output is filtered by the low-pass filter before arrival at the primary amplifier input.

A forward path may be defined from the amplifier input to the primary amplifier input. This path comprises the low-pass filter. Other filters and components may be provided in the forward path if desired.

A feedback path may be defined from the primary amplifier output to the primary amplifier input. The low-pass filter is also present in this path. Naturally, different low-pass filters may be provided in the feedback path and the forward path, but it is preferred that the feedback path and the forward path have a common path portion comprising the low pass filter.

The desired parameters and operation of the low-pass filter are described above.

A final aspect of the invention relates to an amplifier comprising:
an amplifier input,
a primary amplifier according to the fifth aspect, and
a compensator configured to be disabled and having:
a compensator input operatively connected to the primary amplifier output and to the amplifier input, and
a compensator output operatively connected to the primary amplifier input.

Naturally, all embodiments, situations and considerations relating to the above aspects are equally relevant for this aspect.

Naturally, the amplifier has an output which may be connected to the primary amplifier output or may be formed by the primary amplifier output. A filter may be provided at the primary amplifier output as described above.

The compensator is provided between the primary amplifier input and the amplifier input and the primary amplifier output. Thus, a signal received at the amplifier input is filtered by the compensator before arrival at the primary amplifier input. Additionally, a signal received from the primary amplifier output is filtered by the compensator before arrival at the primary amplifier input.

A forward path may be defined from the amplifier input to the primary amplifier input. This path comprises the compensator. Other components, such as filters, may be provided in the forward path if desired.

A feedback path may be defined from the primary amplifier output to the primary amplifier input. The compensator is also present in this path. Naturally, different compensators may be provided in the feedback path and the forward path, but it is preferred that the feedback path and the forward path have a common path portion comprising the compensator.

The desired operation and implementation of the compensator is described further above.

In an embodiment, the primary amplifier is configured to act substantially as an integrator. If the primary amplifier is a class D amplifier, this can be done by configuring the first feedback filter to be a high pass filter with negligible gain at DC.

Advantageously then, one or more further feedback paths may be provided, only one of which has a substantial DC gain. This is a further aspect of the invention.

A number of additional technologies and solutions may be found in Applicant's co-pending applications titled "AMPLIFIER CIRCUIT" and "AN AMPLIFIER WITH AN AT LEAST SECOND ORDER FILTER IN THE CONTROL LOOP" which are filed on even date and hereby incorporated herein by reference in their entireties.

BRIEF DESCRIPTION OF THE DRAWINGS

In the following, preferred embodiments of the invention are illustrated with reference to the drawing, wherein:

FIG. 5 illustrates a circuit implementation of the summing node 1, third feedback filter 12 and the first forward filter 2, where forward filter 2 is a first order lowpass filter.

FIG. 6 illustrates a circuit implementation of the summing node 1, third feedback filter 12 and the first forward filter 2, where forward filter 2 is an integrator.

FIG. 7 illustrates a circuit implementation of the summing node 1, third feedback filter 12 and the first forward filter 2, where forward filter 2 is a second order lowpass filter.

FIG. 8 illustrates a circuit implementation of summing node 4, forward filter 3, second feedback filter 11 and compensator 5, where compensator 5 is an op amp with a capacitor used as compensation network 51 in parallel with a diode network 52 connected between the output and the inverting input thus making compensator 5 a saturated integrator and where forward filter 3 is a resistor and second feedback filter 11 is a high-pass filter.

FIG. 9 illustrates another network that may also be used as compensation network 51, making the compensator a function having two DC poles and one real zero.

FIG. 10 illustrates another network that may also be used as compensation network 51, making the compensator a function having one real zero and two complex poles of which only the magnitude can be freely chosen.

FIG. 11 illustrates another network that may also be used as compensation network 51, making the compensator a function having one real zero and two complex poles that can be freely chosen.

FIG. 12 illustrates another network that may also be used as compensation network 51, making the compensator a function having two real zeros and one DC pole and two complex poles of which only the magnitude can be freely chosen.

FIG. 13 illustrates another network that may also be used as compensation network 51, making the compensator a function having two real zeros and one DC pole and two complex poles which can be freely chosen.

FIG. 14 illustrates another network that may also be used as compensation network 51, making the compensator a function having three real zeros and two pairs of complex poles of which only the magnitude can be freely chosen.

FIG. 16 illustrates another network that may be used as feedback network 52 to effect saturation of the compensator.

FIG. 17 illustrates a circuit implementation of compensator 5 where saturation is implicitly applied by letting the operational amplifier clip against its supply rails.

FIG. 18 illustrates a circuit implementation of compensator 5a for use in the embodiment of FIG. 2, where no means of saturation is provided but a field effect transistor is connected across compensation network 51 in order to re-set the compensator.

FIG. 19 illustrates a circuit implementation of compensator 5a for use in the embodiment of FIG. 2, where a switch is placed in series with the integrator to hold the integration but not reset the integrator.

FIG. 20 illustrates a fully differential circuit implementation of compensator 5a for use in the embodiment of FIG. 2 having three poles (of which two a resonant pair) and two zeros, executed using three op amps, and with reset switches across every capacitor.

FIG. 21 illustrates a circuit implementation of forward filter 3 and second feedback filter 11 where forward filter 3 is a first order low pass filter.

FIG. 22 illustrates a circuit implementation of the summing nodes 6 and 7 and the first feedback filter 10 where first feedback filter 10 is a high-pass filter.

FIG. 23 illustrates a circuit implementation of the summing nodes 6 and 7 and the first feedback filter 10 where first feedback filter 10 is a high-shelf filter.

FIG. 24 illustrates a simplified circuit of a linear amplifier configured as a voltage follower, indicating where improved versions of compensation network 51 can be substituted.

DETAILED DESCRIPTION OF VARIOUS EMBODIMENTS

Figure 1:
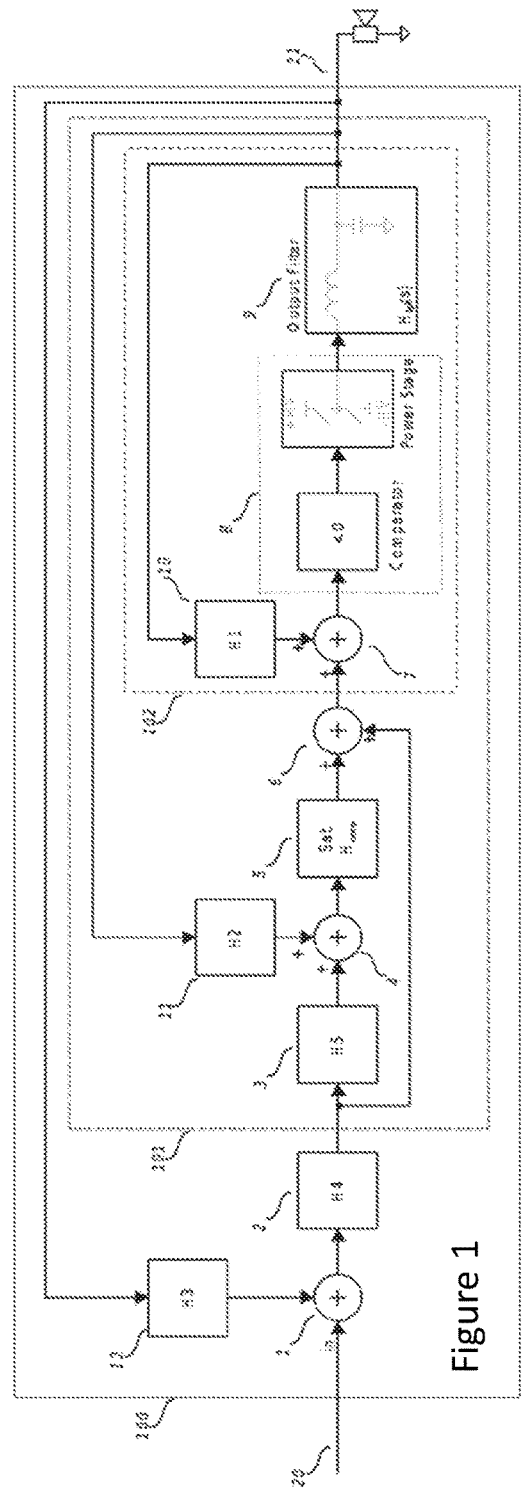
FIG. 1 illustrates a first embodiment of a class D power amplifier according to the invention.

In FIG. 1, an amplifier 100 is illustrated having an input 20, an output 21, a gain stage (boxes 8 and 9), four summing nodes, 1, 4, 6, 7, a first feedback filter 10, a second feedback filter 11, a third feedback filter 12, a first forward filter 2, a second forward filter 3 and a compensator 5.

A primary amplifier is indicated as box 102 and a secondary amplifier as box 101.

A forward path is defined between input 20 and the input into the primary amplifier 101, and multiple feedback paths are illustrated, all between the output 21 and a summing node.

An internal feedback path is defined between the output 21 and the summing node 7, and an internal feedback loop is defined from the output 21, through filter 10, summing node 7, amplifier gain stage 8 and the filter 9.

Through input 20 an audio signal is fed into summing node 1. Output 21 is connected to summing node 1 through feedback filter 12. In the preferred embodiment, feedback filter 12 is a resistor as shown in FIG. 5 but it could also contain a filter to allow further shaping of the frequency response of the amplifier 100. The output of summing node 1 is fed into a forward filter 2. In the preferred embodiment forward filter 2 is a first order low-pass filter as shown in FIG. 5, with a corner frequency above the audio band. The output of forward filter 2 is connected both to summing node 6 and to summing node 4 through forward filter 3. Summing node 4 also receives the signal of output 21 through feedback filter 11. Summing node 4 feeds the compensator 5. The compensator 5 feeds summing node 6. The compensator is arranged so that it is disabled when the amplifier clips. The forward path has parallel portions where one portion comprises filter 3, summing node 4 and filter 5 and where the other portion is the direct connection from the input of filter 3 to summing node 6.

A feedback path is defined from output 21 through filter 11 to summing node 4. This feedback path forms part of a feedback loop comprising also the compensator 5, summing node 6 and the primary amplifier 102. Thus, the feedback loop comprises a control circuit formed by filter 11 and the compensator 5.

In this embodiment, the compensator comprises an operational amplifier, 50, which is a compensator gain stage, with a capacitive compensation network 51 connected between the output and the inverting input of the operational amplifier. This is illustrated in FIG. 8. When designing filter circuits employing feedback networks around op amps it is common practice to provide a duplicate of these feedback network between ground and the non-inverting input of the op amp in order to obtain a circuit with a differential input. Among other advantages this allows for free choice of inverting or non-inverting operation. For clarity however, such duplicate feedback networks are not shown in the drawings and any inversions necessary to restore correct polarity are implied.

The simplest such capacitive feedback network is simply a capacitor as in FIG. 8. The resulting circuit is an integrator i.e. a circuit whose gain is inversely proportional to frequency. This is also called a first-order filter or a one-pole filter, the "pole" being a (real or complex) frequency where gain is infinite, and where the "order" is the number of poles. In a simple integrator the pole is at (or in practice very close to) 0 Hz. The ratio of Ifb and Vcomp is inversely proportional to the compensator gain which is desired to be high in the desired operating frequency range. For the purposes of this disclosure, a capacitive network is understood to be a circuit that generates a feedback current Ifb whose magnitude relative to the op amp output voltage Vcomp increases with frequency, at least in the range between the operating bandwidth of the amplifier and half the switching frequency. As an example the ratio between Ifb and Vcomp may increase tenfold between 20 kHz and 200 kHz. As another example the ratio between Ifb and Vout may increase tenfold between 80 kHz and 800 kHz. Moreover, the Ifb/Vcomp ratio is low in the described amplifier operating range to secure a high compensator gain.

Figure 15:
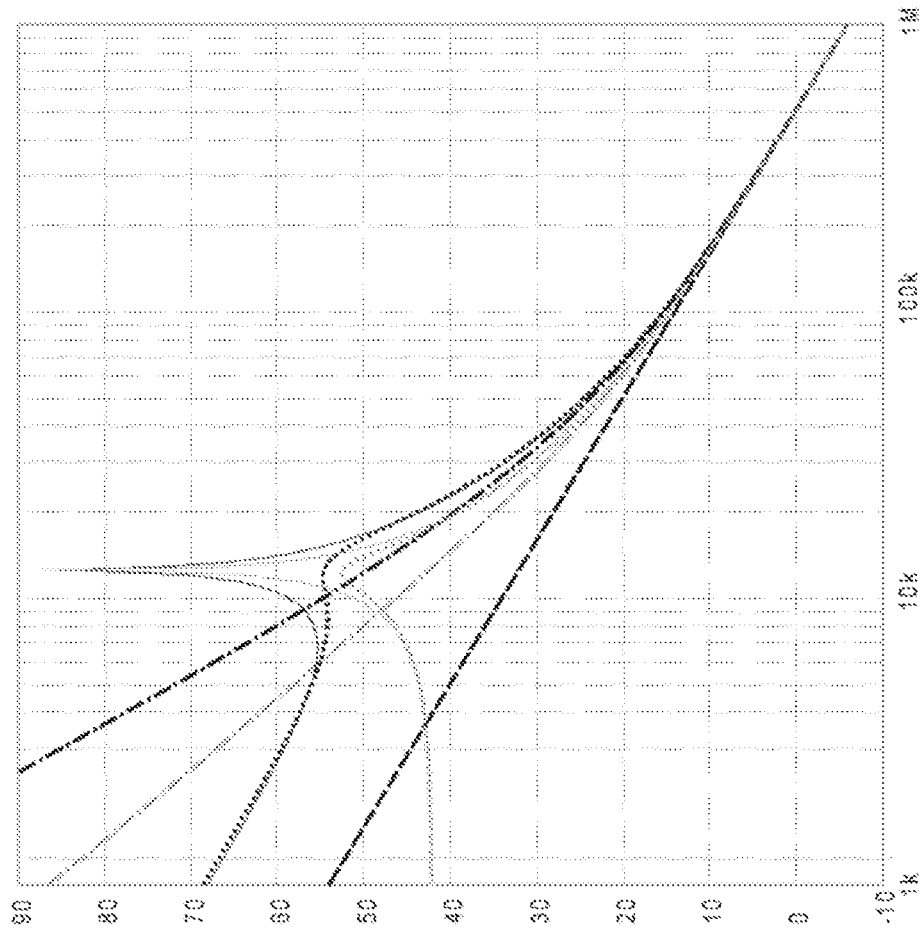
FIG. 15 illustrates typical curves of the gain obtained by a circuit like that of FIG. 8 with the compensation network 51 of FIG. 8 (dashed, black), FIG. 9 (dashdot, grey), FIG. 10 (dotted, grey), FIG. 11 (solid, grey), FIG. 12 (dotted, black), and FIG. 13 (solid, black) used.

In FIG. 9, a second order response is illustrated. As an example of the type of response obtained is shown in the grey dashdot line of the graph in FIG. 15. At low frequencies, gain is inversely proportional to the square of frequency as evidenced by a downward slope of (40 dB/decade). At high frequencies the response transitions to a first order (20 dB/decade) slope. This type of behaviour is highly desirable for compensators. The filter is designed such that the transition to a first order slope happens before the point where loop gain becomes 1, therefore reducing the phase shift to a sufficiently low value to permit stable operation. At the same time, the faster slope at low frequencies permits higher loop gain at low frequencies than a simple first order circuit would. The refinements in FIG. 10 and FIG. 11 serve to move the frequency, where gain is highest, to a higher frequency, at the expense of loop gain at DC (dotted grey and solid grey in FIG. 15).

The low-frequency loop gain may be further increased (i.e. increase the order) without using additional amplification stages. Hitherto, compensators of orders 3 and higher have only been implemented using one amplification stage per order as illustrated in FIG. 20.

In FIG. 8, the inverting input terminal of op amp 50 is operated as a virtual short and the compensation network 51 is a capacitor that acts as a differentiator, its output current Ifb being the derivative of Vcomp. Otherwise put, Vcomp is the integral of the current Ifb. The network of FIG. 9 acts as a differentiator cascaded with a first order high-pass filter. This network can be extended by adding additional high-pass sections. Adding one more high-pass section results in a response like that shown in the black dash-dot line in FIG. 15. A resistor bridging two of the three capacitors (as shown in FIG. 12) will again move two poles up in frequency as shown in the dotted black line in FIG. 15. FIG. 13 shows a method of increasing the Q of the two poles which does not require a three-component parallel T network as was needed to produce the same effect in the two-pole case of FIG. 11. Finally, FIG. 14 shows that the method can be extended to an arbitrary number of poles by cascading further high-pass sections (optionally with parallel networks to move the poles up in frequency).

This insight is not only applicable to control circuits for class D amplifiers. FIG. 24 shows the basic circuit of a standard operational amplifier (actual op amps may use bipolar transistors, j-FETs, MOSFETs or similar devices, or a mixture, and may contain additional bias, cascode or protection circuits). Compensation network 51, here a capacitor, takes the position of "compensation capacitor". Here too, such a network improves audio fidelity.

Even though the compensation network 51 may be implemented in a number of manners, the use of passive components has its limitations. Clearly, the output of the assembly of the amplifier stage and the network is the inverse of the characteristic of the network.

Combining the compensator (comprising the gain stage and the compensation network 51) with another feedback loop acting in parallel provides additional manners of affecting the overall characteristic of the circuit or amplifier.

Figure 29:
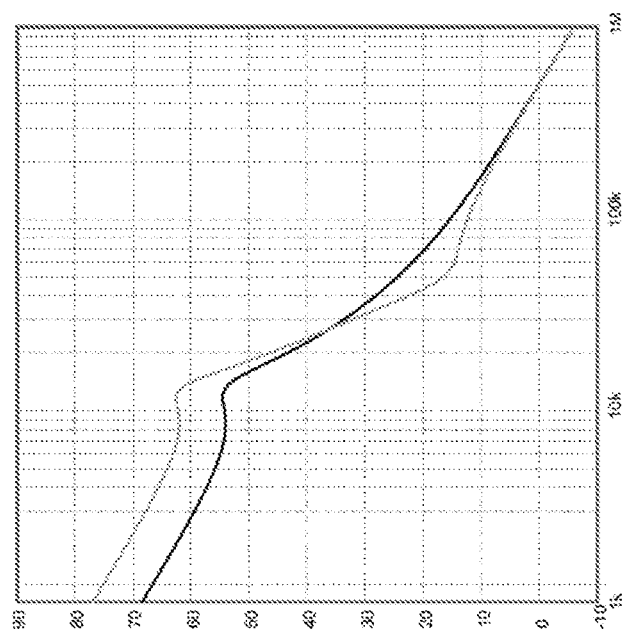
FIG. 29 illustrates gain curve for a compensator with a third order network and the gain curve obtained by the combined effect of such a compensator and an additional feedback loop.

In FIG. 29, a black graph is illustrated describing the gain of an amplifier stage with a feedback network of third order. It is seen that the transition from the third order slope to the first order slope is rather slow.

The grey curve is obtained using a feedback as described below. This feedback may provide an anti-resonance or dip in the gain curve. This will provide a dip in the overall gain curve, as is seen in the grey curve. Now, the transition from the third order slope to the first order slope is much more localized, which gives a better performance, in the form of higher gain, in the audible frequency interval.

Referring to FIG. 1, two feedback paths are described, one being via the filter 10 and one being via the filter 12.

In one embodiment of the invention, it is noted that in the context of the primary amplifier 102, the first feedback filter 10 fulfils a function similar to the one fulfilled by the compensation network 51 in the context of the compensator 5. That is to say, the gain of the compensator is approximately inversely proportional to the gain of compensation network 51. If the compensation network 51 is a capacitor, the compensator 5 will behave like an integrator. If the compensation network 51 is a higher order differentiating network like those shown in FIG. 9 and following until FIG. 14, the compensator will act like higher order integrators. Likewise, the gain of the primary amplifier 102 is approximately inversely proportional to the gain of the feedback filter 10. Substituting a higher order differentiating network for the capacitor in first feedback filter 10 will therefore increase the gain of the primary amplifier 102. Signal cancellation is again obtained by providing a similar network for the known single capacitor in second feedback filter 11.

Figure 27:
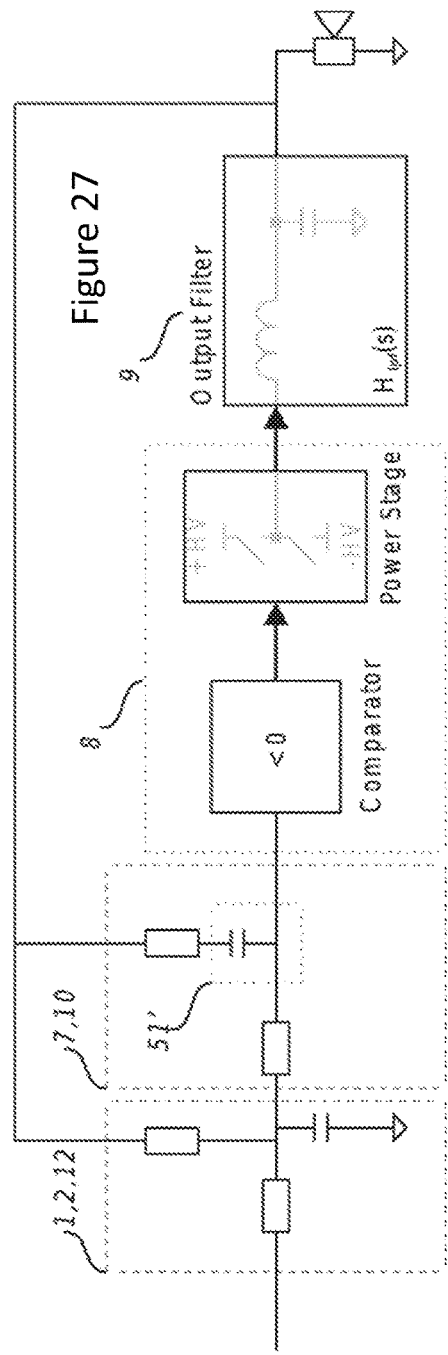
FIG. 27 illustrates a prior art amplifier with approximate equivalent functions marked, namely a first order high pass filter as the first feedback filter 10 and a first order low pass filter as the first forward filter 2.

FIG. 27 illustrates a known, simple circuit whose performance is acceptable in many audio applications. In terms of the elements named in the present description, it can be broken down as a forward filter 2, a first feedback network 10, a gain stage 8 and an output filter 9, where summing nodes 1 and 7 are implemented as circuit junctions. Modifying the first feedback filter 10 by substituting a higher order differentiating network for the capacitor improves loop gain in such a circuit in an inexpensive manner.

In the preferred embodiment a second feedback network 52 is connected to provide saturation i.e. to prevent the voltage across the capacitive feedback network 51 from becoming greater than a pre-set limit. This second feedback network may be as simple as a pair of antiparallel diodes as shown in FIG. 8, or may be a more sophisticated circuit such as the one from FIG. 16. In yet another embodiment op amp 50 is simply powered from supply voltages chosen so that the output Vcomp of op amp 50 is naturally saturated just outside the normal operating range (FIG. 17).

It can be verified experimentally if signal cancellation and saturation are employed together to the effect that the compensator is arranged to disable its operation when the primary amplifier clips. First an audio signal is applied to input 20 with a sufficient amplitude to cause severe clipping of the primary amplifier 102. As the input signal, a sine wave, which continually sweeps between 20 Hz and 20 kHz, is used. The peak-to-peak value Vclip of the output signal 21 is recorded. During this test, saturation of the compensator 50 should be observed (observation 1). Next, the level of the audio signal is reduced until the peak-to-peak value of output signal 21 is 70% of Vclip. Now, no saturation of the compensator 50 should be observed (observation 2). Next, the gain of the first feedback filter 10 is changed by 10% at least in the range of DC to 20 kHz. Saturation of the compensator 50 should again be observed, even though the primary amplifier 102 is far from clipping (observation 3). If observations 1, 2 and 3 are all true, the compensator is arranged to disable its operation when the primary amplifier clips.

An alternative procedure for establishing if signal cancellation and saturation are employed together to the effect that the compensator is arranged to disable its operation when the primary amplifier clips, is to look for a drastic change in distortion performance when the gain of first feedback filter 10 is changed. First, establish the clipping level of the amplifier by applying a sinusoidal audio signal to the input 20 and adjusting the level until total harmonic distortion measures 10%. Then, reduce the signal level by 40% and measure distortion. Next, change the gain of the first feedback filter by 10% and measure distortion again. If the second distortion figure is at least twice the first distortion figure, the compensator is arranged to disable its operation when the primary amplifier clips. The test could be done at 1 kHz and 6 kHz.

Figure 2:
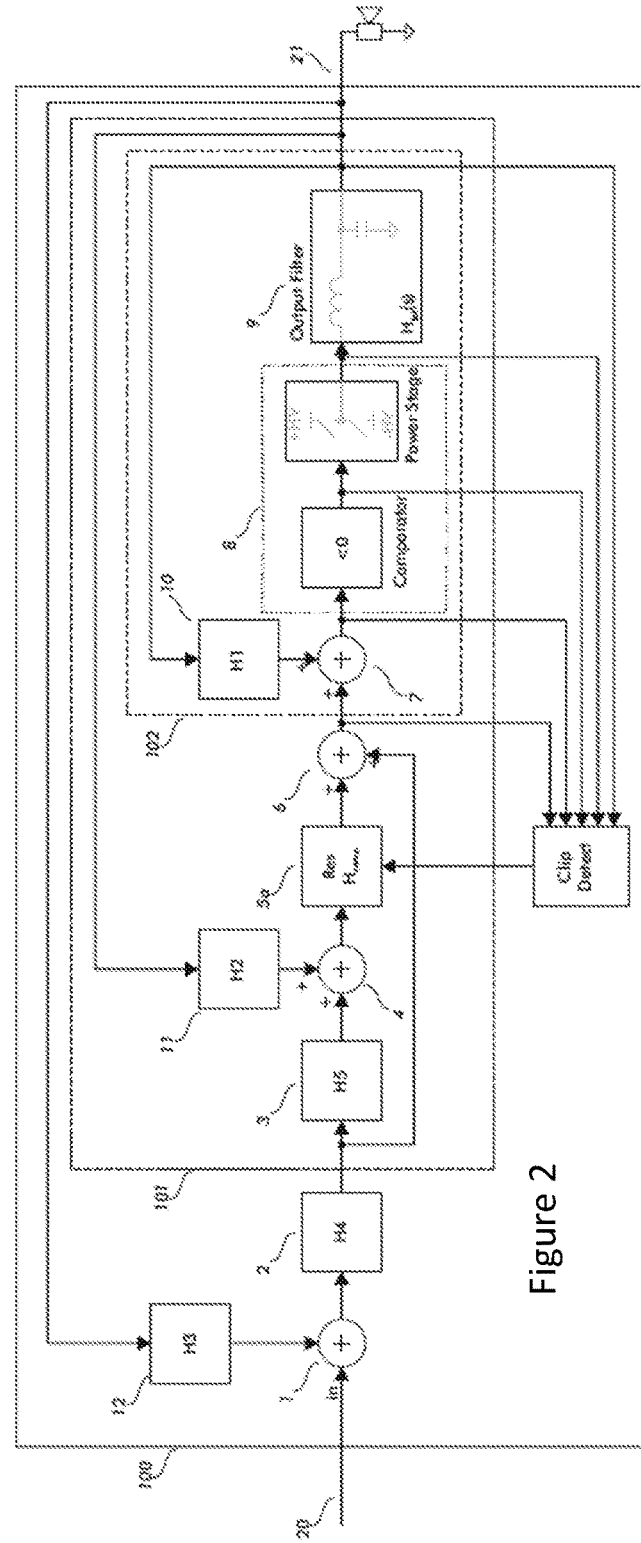
FIG. 2 illustrates a second embodiment of a class D power amplifier according to the invention

In the second embodiment (FIG. 2), a circuit is added that detects clipping of the primary amplifier. Many ways of detecting clipping exist. One method is monitoring the output of summing node 7 with a window comparator. During normal operation, the output of summing node 7 will remain within certain limits as it needs to cross zero to make the output stage change state. When the primary amplifier clips, the output of summing node 7 will grow much larger. This allows easy discrimination of normal operation or clipping. Another method is to time the comparator output. If it stays in high or low for longer than a predetermined maximum, the primary amplifier is deemed to be clipping. Further methods involve comparing the input or output signal to pre-set limits beyond which the primary amplifier is deemed to be clipping.

The output of the clipping detector is then used to control switches 53 (shown in FIG. 18) that short-circuit (i.e. reset) the capacitive feedback network 51. Such switches may be implemented using field effect transistors. A variant using a single capacitor as the feedback network and a field effect transistor acting as reset switch is shown in FIG. 18.

Alternatively, a switch may be arranged to disable further integration. FIG. 19 shows an implementation of a compensator where a switch is arranged to disconnect the input of the compensator when clipping of the primary amplifier is detected, and to reconnect the input of the compensator when the primary amplifier returns to normal operation.

The compensator does not need to be constructed using one op amp and neither does it need to have only one feedback network. Functionally equivalent circuits can be made e.g. using differential feedback networks, differential op amps or multiple op amps. An implementation is shown in FIG. 20 of a third order compensator constructed using three differential op amps and using field effect transistors to reset the individual integrating stages. It will be clear that this implementation is shown to indicate multiple variations at once, and that many useful combinations can be found.

The output of summing node 6 feeds the primary amplifier 102. This amplifier may be a class A, AB, B or D amplifier. In the case that it is a class D amplifier, it may be self-oscillating or oscillator driven. A self-oscillating implementation may comprise a class D gain stage 8, an output filter 9 and feedback filter 10. Gain stage 8 comprises a switching power stage controlled by a comparator (or zero-crossing detector). Gain stage 8 will connect its output either to a positive or a negative power supply rail depending on the sign of the input signal applied to the comparator. Constructed in this manner, primary amplifier 102 operates as a self-oscillating amplifier. If a periodic reference signal such as a triangle wave is connected to the noninverting terminal of Gain stage 8, the amplifier is no longer self-oscillating. Its operating frequency and gain will instead be determined by the frequency, shape and amplitude of the reference waveform. In prior art amplifiers, feedback filter 10 was designed so that the frequency response of the primary amplifier 102 was flat enough for audio use. This does not have to be the case in the present invention where feedback filter 10 may have negligible gain at DC. In the preferred embodiment, feedback filter 10 consists of only a resistor and a capacitor in series (FIG. 22). Consequently the frequency response of primary amplifier 102 approximates a low-pass filter with a large DC gain and a low corner frequency. Over most of its useable bandwidth it has a 20 dB/decade downward slope. For practical purposes primary amplifier 102 behaves like an integrator.

In the preferred embodiment, forward filter 3 has a constant gain (e.g. is a resistor) and feedback filter 11 is an exact copy of feedback filter 10 with a resistor in parallel to take into account the fact that the DC gain of the primary amplifier is not infinite, thereby improving signal cancellation. This shows that it is advantageous to have separate circuits for feedback filters 10 and 11. This arrangement is shown in FIG. 1. The frequency response of the secondary amplifier 101 closely matches the frequency response of the primary amplifier 102 alone. It may be advantageous to numerically optimize forward filter 3 and feedback filter 11 together to obtain further improved cancellation of the audio input signal at the output of the saturated compensator 5. FIG. 21 shows an example where forward filter 3 is a first order low pass filter.

It is preferred to obtain a closed loop frequency response approximating a second or higher order low-pass filter with the possibility of attaining a Bessel, Butterworth or Chebyshev response or anything in-between. A way of constructing a second order low pass filter with a resonant corner (having a Q factor over 0.5) is placing two first-order low-pass filters inside a common feedback loop. To obtain a second order low-pass frequency response from amplifier 100, secondary amplifier 101 and forward filter 2 are used as the constituent parts of such a low-pass filter. The feedback loop is closed through feedback filter 12 and summing node 1. In the preferred embodiment the secondary amplifier 101 has a large DC gain but a very low corner frequency. FIG. 22 shows an implementation of first feedback filter 10 that would effect such a response. Generally, to obtain such a characteristic for the secondary amplifier 101, first feedback filter 10 should be configured to have very low gain at DC and high gain at high frequencies (e.g. the switching frequency, 200 kHz, 100 kHz). If first feedback filter 10 has nonzero gain at DC, the frequency at which its gain has increased by 3 dB above its DC gain should be low (e.g. below 20 kHz, e.g. below 2 kHz). If first feedback filter 10 is a first order high pass filter, an approximately second order frequency response may be obtained for amplifier 100 by enclosing secondary amplifier 101 in a feedback loop with a forward filter 2 if forward filter 2 is configured as a first-order low-pass filter. FIG. 5 shows an implementation of such a forward filter 2. Any desired corner frequency and Q factor for the frequency response of amplifier 100 can be obtained by varying the gain and the corner frequency of forward filter 2.

It will be clear to the person skilled in the art that the same frequency response for amplifier 100 is available with different choices of feedback filter 10 and forward filter 2. For example FIG. 23 shows an implementation of feedback filter 10 that permits the secondary amplifier to have a low DC gain but conversely a high corner frequency. Subsequently configuring forward filter 2 as an integrator allows the Q factor of the frequency response of amplifier 100 to be chosen freely. An implementation configuring forward filter 2 as an integrator is shown in FIG. 17. It is an objective of the invention that the additional signal processing (here forward filter 2) does not suffer from integrating windup. Although it would be more in line with conventional amplifier design strategy to configure forward filter 2 as an integrator, clipping of the primary amplifier would cause the output of forward filter 2 to keep growing so long as clipping persists, causing integrating windup. Therefore, it is preferred to configure forward filter 2 as a low-pass filter and to configure the primary amplifier to have high DC gain and a low corner frequency (e.g. below 20 kHz, e.g. 1 kHz).

It is desired that the additional signal processing provides low-pass filtering between the amplifier input and the comparator. Since forward filter 2 is a low-pass filter or an integrator, this is obtained.

Higher order low-pass behaviour can be obtained by increasing the order of the forward filter 2. This can be done, for example, as shown in FIG. 7. This further improves the attenuation of high-frequency components in the input signal that reach the comparator.

Figure 25:
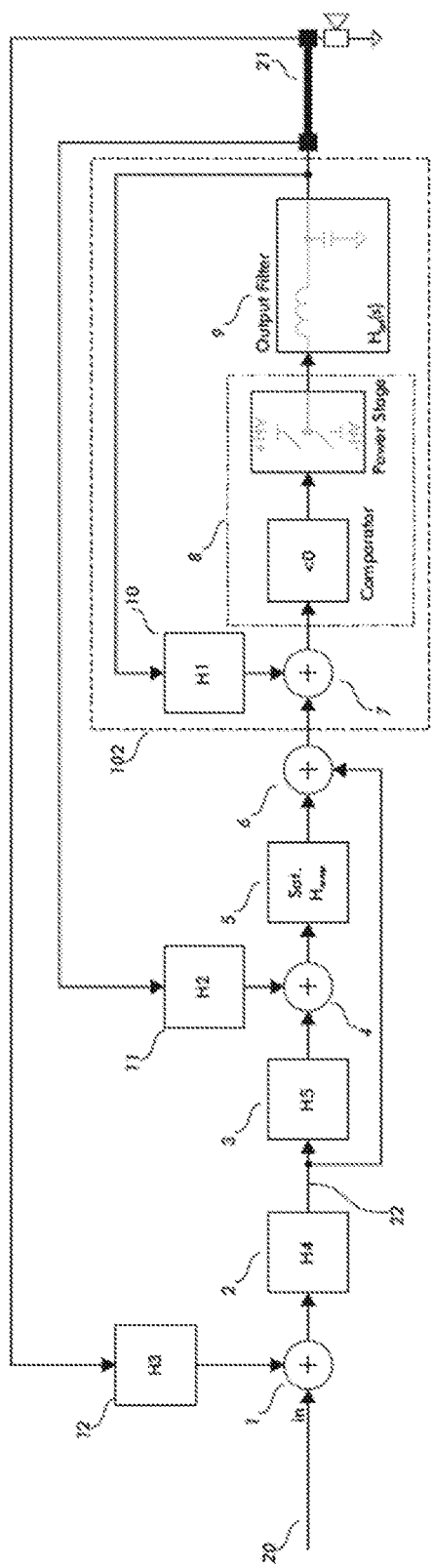
FIG. 25 illustrates an assembly according to the present invention, of a secondary amplifier 101, forward filter 2, third feedback filter 12, a cable and a load where the input signal to the third feedback filter 12 is connected at the end of the cable to which the load is attached.
Figure 26:
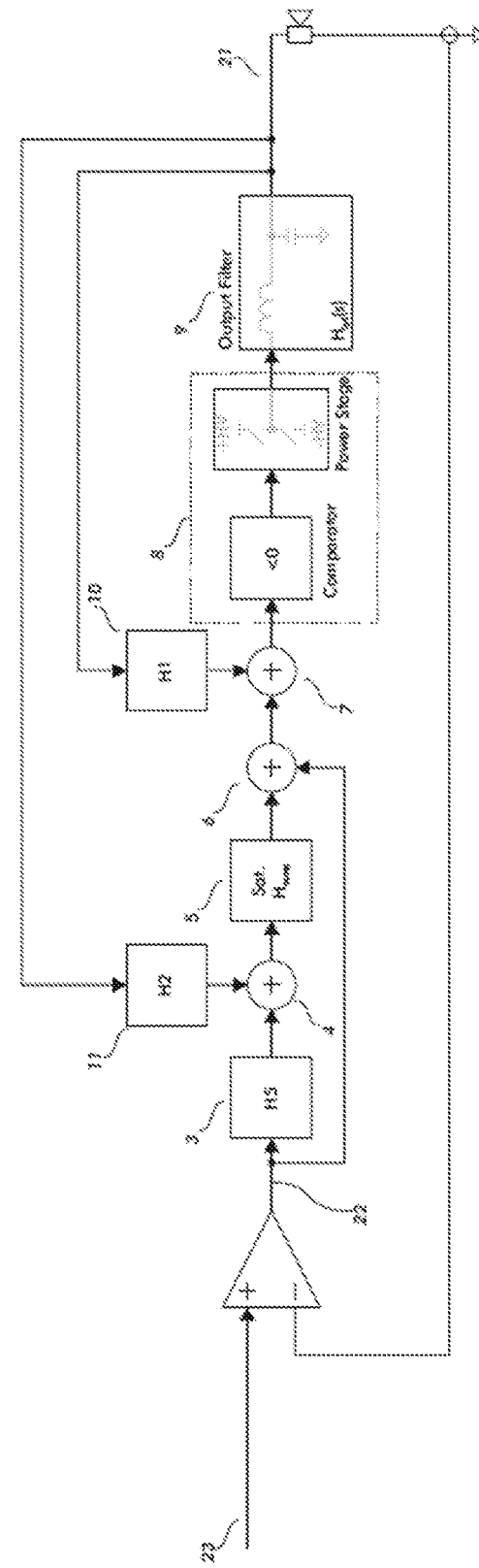
FIG. 26 illustrates an assembly according to the present invention, of a secondary amplifier 101, which is configured as an integrating amplifier, a difference amplifier 13, a load and a current sensor 14, where the integrating amplifier is configured to respond to the difference between the input signal and the output signal of the current sensor.

It is preferred that the amplifier be more amenable to remote sensing. As illustrated in FIG. 1 thru FIG. 4, the input of the third feedback filter 12 is connected to the load independently of the inputs of second feedback filter 11 and first feedback filter 10. This allows the input of the third feedback filter 12 to be connected at the far end of the cable connecting the amplifier and the loudspeaker load, whereas feedback filters 11 and 10 may be connected at the near end. This arrangement is shown in FIG. 25. This is possible because forward filter 2 is a low pass filter or an integrator, making it insensitive to high frequency components that may be present or missing at the far end of the cable. Also, forward filter 2 does not rely on signal cancellation to prevent integrator windup, so the gain error introduced by the resistance of the cable is of no consequence. By contrast, connecting the second feedback filter 11 at the far end will result in the output signal of the compensator becoming very large.

Figure 28:
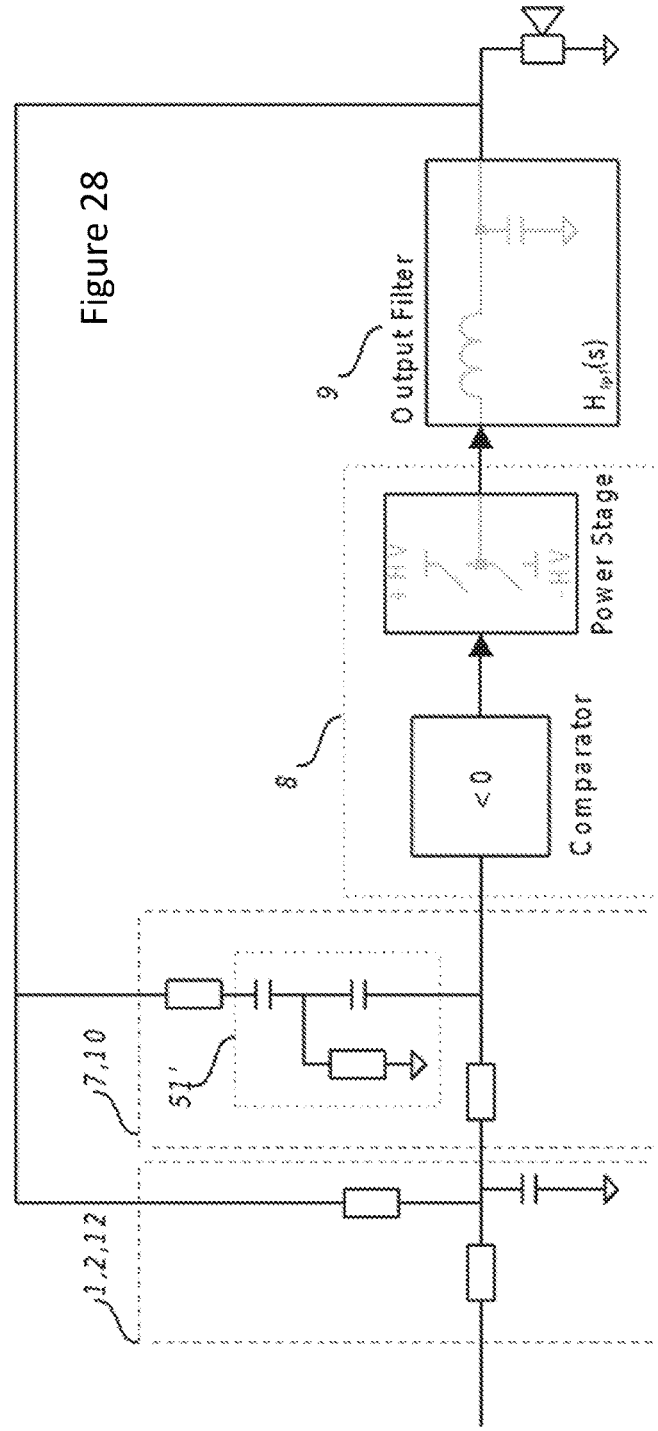
FIG. 28 illustrates an amplifier according to the invention, showing the use of a second or higher order highpass filter in the first order feedback filter.

By looking at the remote sensing feedback arrangement of FIG. 25, clearly, if the secondary amplifier 101 is configured to act as an integrator, it is in fact operating as a power op amp. In one embodiment, the secondary amplifier 101 is configured as an integrator, so it can be used in many applications requiring the use of a power op amp. FIG. 28 shows an arrangement of secondary amplifier 101 used as a power op amp in conjunction with a current sensor to act as a controlled current source. The current sensor may be a resistor, a current sense transformer or a hall sensor. Its output is typically a voltage proportional to the load current. This voltage is subtracted from the input signal and applied to the input of primary amplifier 102. The subtraction may be done using a simple fixed gain difference amplifier, but additional filtering may be provided also.

Figure 3:
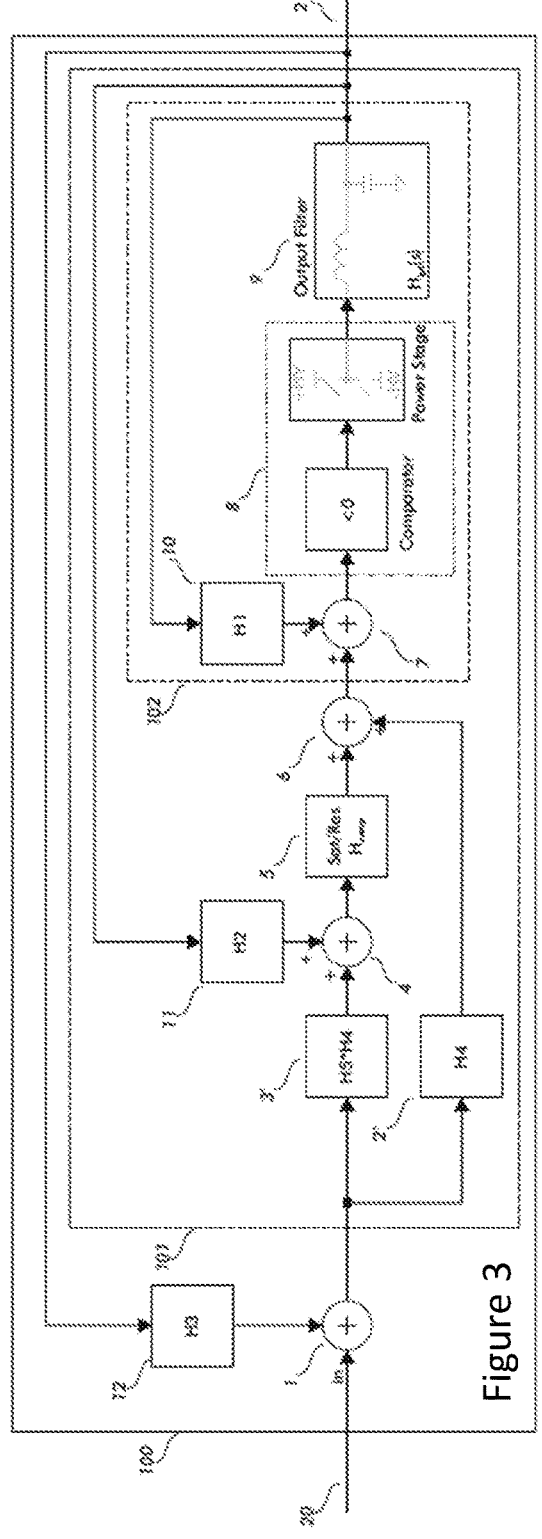
FIG. 3 illustrates a third embodiment of a class D power amplifier according to the invention

In FIG. 3 an alternative embodiment is shown. It is obtained from FIG. 1 by simple block diagram manipulation. Filter 3' now combines the transfer functions of filters 2 and 3, while filter 2' is identical to filter 2 but is now only inserted in the parallel connection between summing nodes 1 and 6. This clearly illustrates that it is possible to deviate from the exact structure of FIG. 1 without in any way changing the operation of the circuit. This method may be advantageous by allowing separate tweaks to the two versions of H4 (previously filter 2), further improving the accuracy of signal cancellation.

Figure 4:
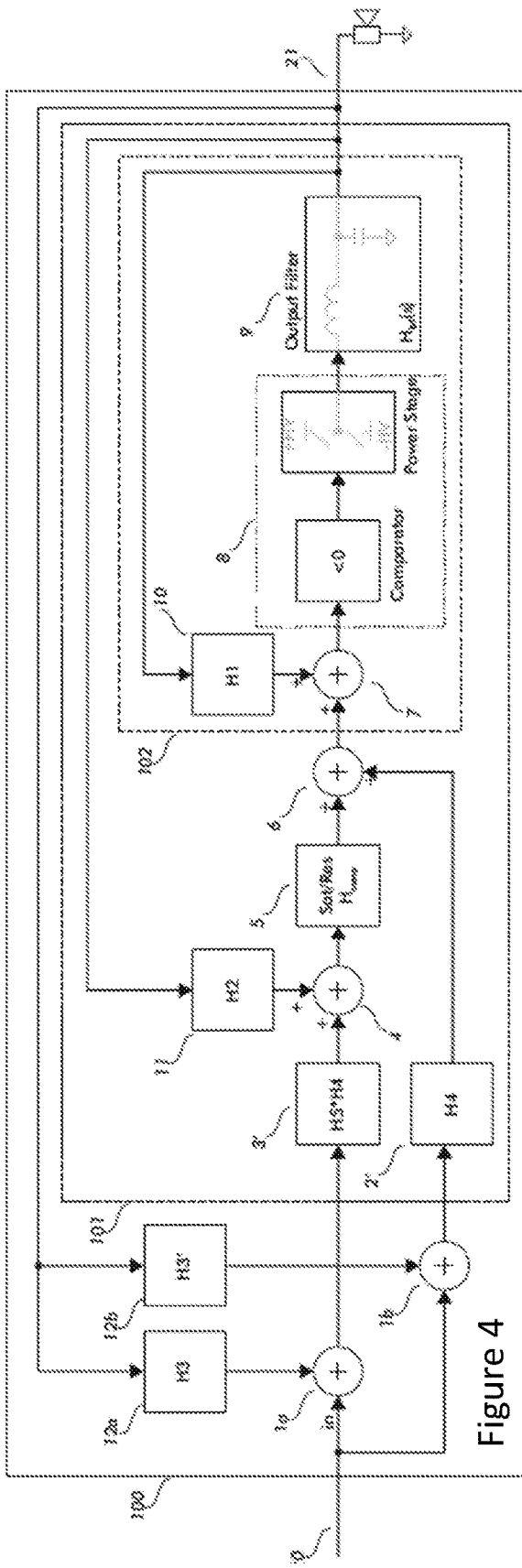
FIG. 4 illustrates a fourth embodiment of a class D power amplifier according to the invention

FIG. 4 shows an implementation where summing node 1 is duplicated along with its input and feedback filter 12 which now appears twice as 12a and 12b. Here too, a potential benefit may be expected in improving signal cancellation, as well as allowing different choices for the amplification stages used in 2' and 3'.

It will be plain to the person skilled in the art that such rearranging of functional blocks can yield further embodiments that nevertheless do not deviate from the teachings of this invention. When the first path comprises at least a compensator that is disabled when the primary amplifier clips, a second path may be provided which does not include that compensator but which comprises at least a first order low-pass filter.

It follows that the path that does not comprise the compensator can be characterised by taking the steps of 1) disabling the primary amplifier, 2) disabling the compensator, 3) applying a sinusoidal stimulus to the input 20 and 4)

measuring the signal level found at the input of the primary amplifier 102. This measurement is first done at a first frequency which is twice the corner frequency of the amplifier 100, yielding a first signal level, and repeated at a second frequency which is four times the first frequency, yielding a second signal level. If the second level is less than one-third of the first level, the second path behaves like at least a first order low pass filter.

It may be impractical to isolate the input of the primary amplifier for this purpose, because summing nodes are often implemented as circuit junctions. In that case, an alternative test method may be applied in which the amplifier operates normally. Since the use of a first-order filter as the forward filter 2 will result in amplifier 100 operating as a second-order low-pass filter, this characteristic can be tested directly. To this end, a sinusoidal stimulus is connected to the input 20 and the level is measured at the output 21. This test is again done at two frequencies. First at a first frequency which is twice the corner frequency of the amplifier 100, yielding a first signal level, secondly at a second frequency which is twice times the first frequency, yielding a second signal level. If the second level is less than one-third of the first level, the second path behaves like at least a first order low pass filter.

The invention claimed is:

1. An amplifier comprising:
   a compensator having:
   a network comprising two ports between which at least three capacitors are connected in series and between each pair of capacitors a resistor is connected to a predetermined voltage, and
   a gain stage having:
   an gain stage input, connected to one port and
   an gain stage output connected to the other port,
   a primary amplifier having:
   a primary amplifier output operatively connected to the gain stage input and
   a primary amplifier input operatively connected to the gain stage output and
   a feedback filter being a high pass filter provided between the primary amplifier output and the primary amplifier input.

2. The amplifier according to claim 1, where the compensator is configured to have at least two operating modes.

3. The amplifier according to claim 2, where in one operating mode one or more of the capacitors are short-circuited.

4. The amplifier according to claim 3, comprising one or more diodes connected across one or more of the capacitors.

5. The amplifier according to claim 2, where, in one operating mode, the gain stage is turned off.

6. The amplifier according to claim 2, where, in one operating mode, a connection between the gain stage input and the primary amplifier output is disconnected.

7. The amplifier according to claim 2, where the compensator is configured to operate in one operating mode, when the primary amplifier clips, and in another operating mode, when the primary amplifier is not clipping.

8. The amplifier according to claim 1, further comprising a user operable element configured to have the compensator operate in a predetermined mode of operation.

9. The amplifier according to claim 1, further comprising a second network having at least one resistor placed in parallel with one or more of the capacitors.

10. The amplifier according to claim 1, wherein the primary amplifier is a class D amplifier comprising a comparator and a switching power stage controlled by said comparator, the primary amplifier having an idle switching frequency.

11. The amplifier according to claim 10, wherein the primary amplifier further comprises a high pass filter connected between the primary amplifier output and an input of the comparator.

12. The amplifier according to claim 1, further comprising a first loop operatively connecting the primary amplifier output to the gain stage input.

13. The amplifier according to claim 1, further comprising a second loop operatively connecting the primary amplifier output to the gain stage output.

* * * * *